United States Patent [19]

Masuda et al.

[11] 4,364,028

[45] Dec. 14, 1982

[54] INTEGRATING ANALOG TO DIGITAL CONVERTER HAVING OFFSET ERROR COMPENSATION

[75] Inventors: Eiji Masuda, Kawasaki; Yasoji Suzuki, Kanagawa, both of Japan

[73] Assignee: Tokyo Shibaura Denki Kabushiki Kaisha, Japan

[21] Appl. No.: 255,373

[22] Filed: Apr. 20, 1981

Related U.S. Application Data

[63] Continuation of Ser. No. 51,215, Jun. 22, 1979, abandoned.

[30] Foreign Application Priority Data

Jun. 30, 1978 [JP] Japan ................................. 53-79498

[51] Int. Cl.³ .......................................... H03K 13/02
[52] U.S. Cl. ..................... 340/347 NT; 340/347 AD; 340/347 CC; 340/347 M; 324/99 D
[58] Field of Search .... 340/347 M, 347 AD, 347 CC, 340/347 NT; 324/99 D

[56] References Cited

U.S. PATENT DOCUMENTS 3,872,466  3/1975  Wold ............................ 340/347 NT Primary Examiner—T. J. Sloyan
Attorney, Agent, or Firm—Finnegan, Henderson, Farabow, Garrett & Dunner

[57] ABSTRACT

An integrating analog to digital converter having a switching circuit for selecting any one of an analog input voltage, a first reference voltage, or an analog ground voltage; an intermediate voltage selected by the switching circuit and the intermediate voltage generated by the intermediate voltage generating circuit; and a comparator for producing a signal to control the operation of the switching circuit and the voltage level produced by the intermediate voltage generating circuit according to the results of a comparison between the output signal from the integration circuit and a second reference voltage.

10 Claims, 27 Drawing Figures

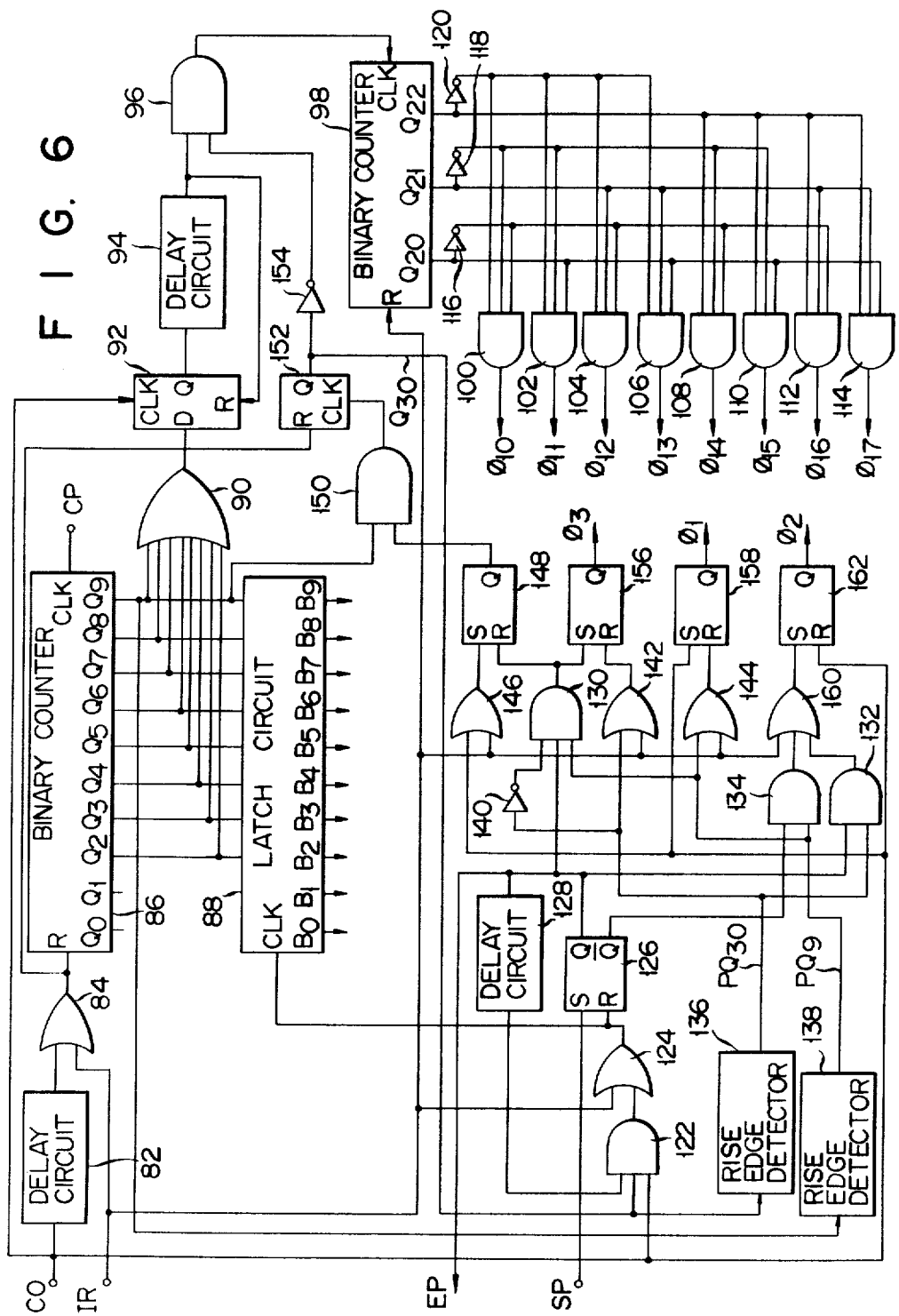
F I G. 6

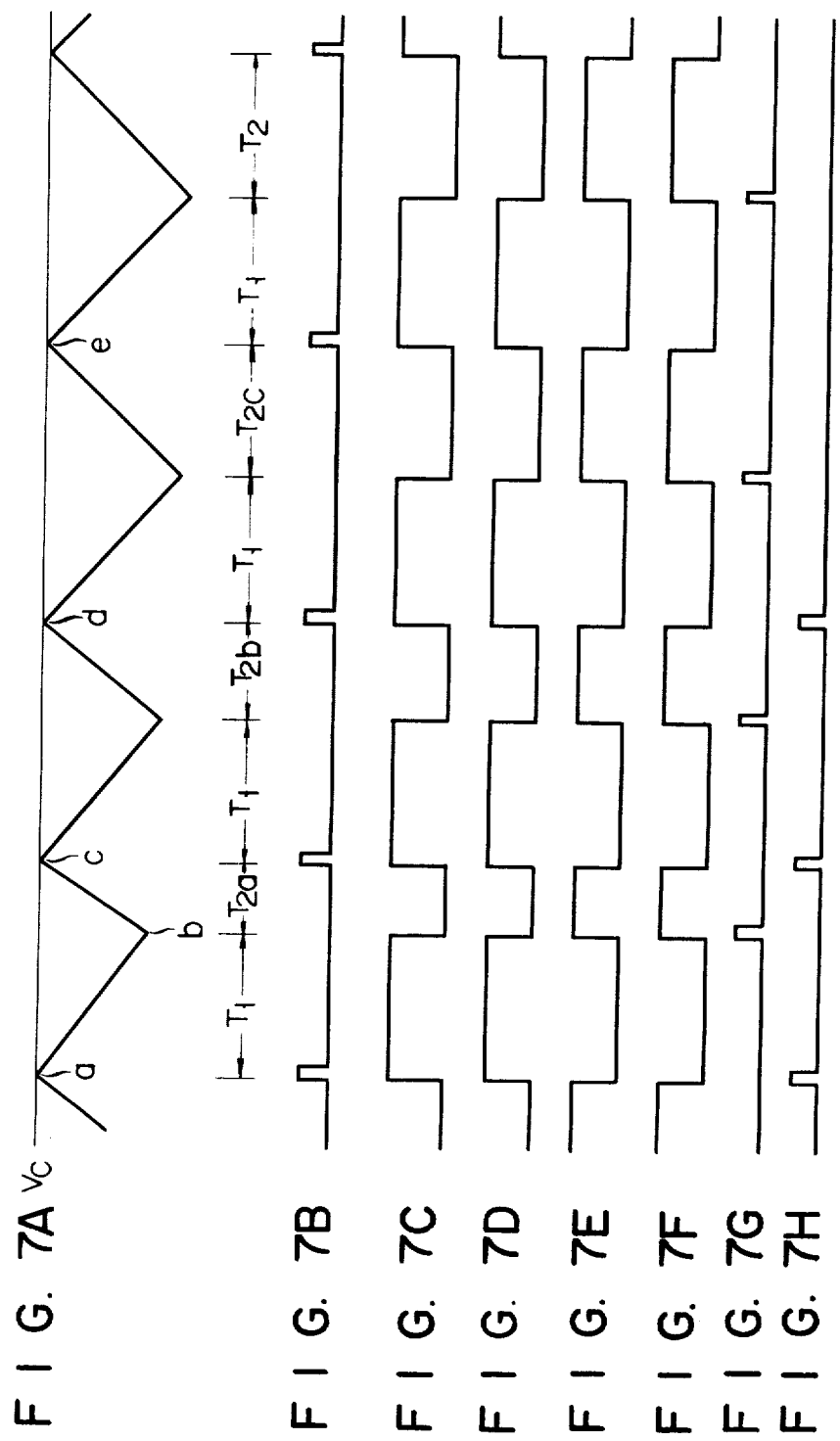

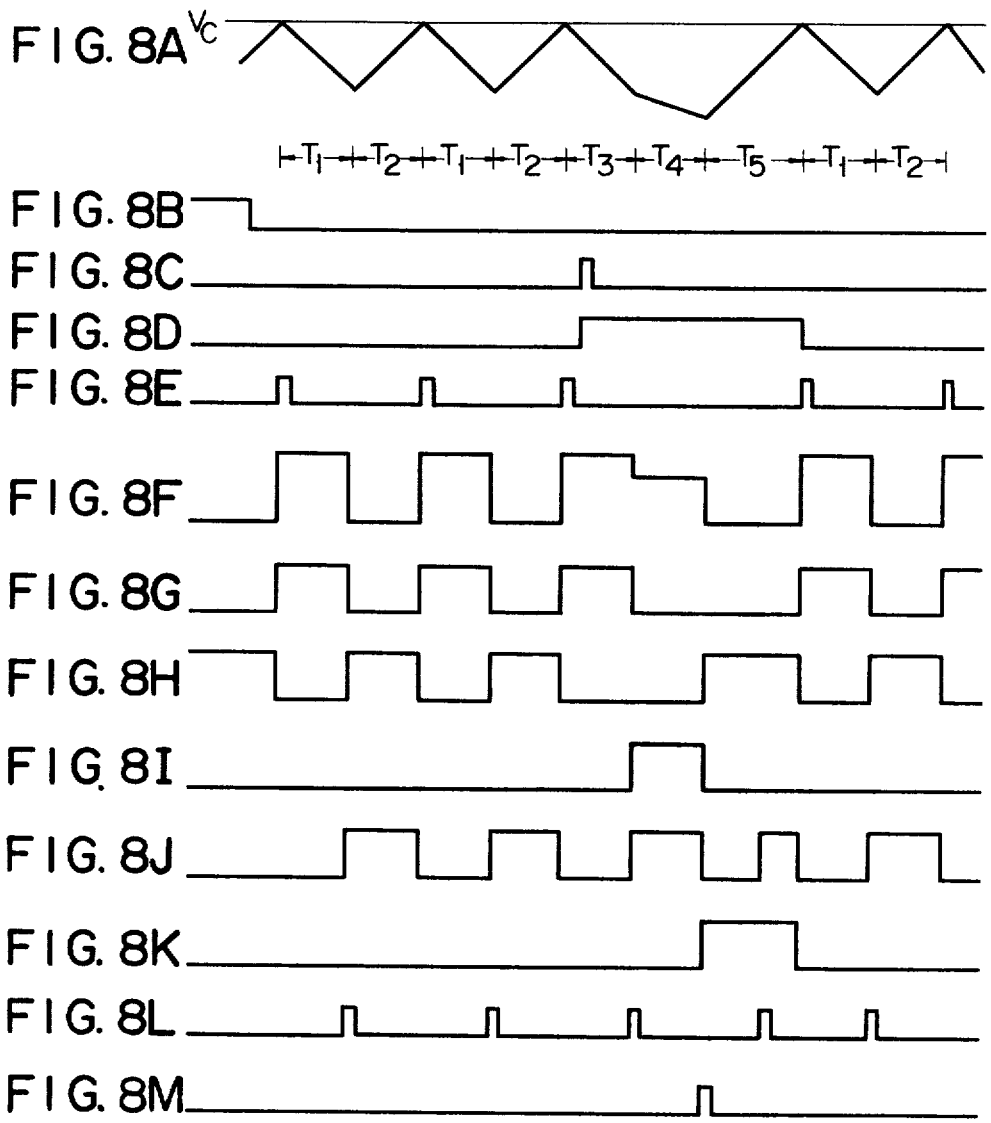

INTEGRATING ANALOG TO DIGITAL CONVERTER HAVING OFFSET ERROR COMPENSATION

This is a continuation of application Ser. No. 51,215, filed June 22, 1979, now abandoned.

BACKGROUND OF THE INVENTION

The present invention relates to an integrating analog to digital converter having offset error compensation.

A conventional integrating analog to digital converter (referred to as an A/D converter) will first be described with reference to FIGS. 1 and 2. A dual-slope A/D converter is illustrated, by way of block diagram, in FIG. 1. A waveform of an integration output signal, which is useful in explaining the operation of the converter is illustrated in FIG. 2. As shown, an analog input voltage $V_{IN}$ to be converted into a digital form and a reference voltage $-V_R$ of opposite polarity to the voltage of $V_{IN}$ are inputted into a switch circuit 2. The switch circuit 2 selectively provides the input voltages $V_{IN}$ and the reference voltage $-V_R$ to an integration circuit 6, under control of a control circuit 4. The integration circuit 6 includes an integration resistor 8, an integration capacitor 10 and an operational amplifier 12. The operational amplifier 12 is grounded at the non-inverted input terminal (+) and is connected at the inverted input terminal (−) to the integration resistor 8. The output voltage from the integration circuit 6 is applied to one input terminal of a comparator 14 and is compared with a threshold voltage Vc provided to the other input terminal of the comparator 14. The comparator 14 produces an output signal of HIGH or LOW level in accordance with the result of the comparison and the output signal is supplied to the control circuit 4. Upon receipt of a start signal SP and the comparison signal, the control circuit 4 produces a counter control signal to a counter circuit 16. In response to the counter control signal, the counter circuit 16 sequentially counts clock pulses CP supplied thereto. The counter output signal is applied to the control circuit 4 and finally is produced in digital form from the counter circuit 16. Upon receipt of the counter output signal, the control circuit 4 supplies a switch control signal to a switch circuit 2 and finally produces an A/D conversion end signal EP.

In such an A/D converter, the switch circuit 2 first selects the analog input voltage $V_{IN}$ during a time period T1 previously set and which in turn is integrated by the integration circuit 6. Following the time period T1, the switch circuit 2 selects the reference voltage $-V_R$ and which in turn is integrated by the integration circuit 6. During a time period T2 until the output signal from the integration circuit 6 reaches the threshold voltage Vc, clock pulses CP are counted by the counter circuit 16. At this time, the analog input voltage $V_{IN}$ and the reference voltage $-V_R$ are expressed by the following equation $$V_{IN} = T2/T1 \times V_R \quad (1)$$

As seen from the equation (1), if the given time period T1 and the reference voltage $-V_R$ are previously known, an unknown analog voltage $V_{IN}$ may be calculated by measuring the second integration period T2. In fact, however, an operational amplifier 12 in the integration circuit 6 has an offset voltage and hence the digital amount expressed by the equation (1) includes an error. When the offset voltage Vos is taken into consideration, the equation (1) is rewritten $$V_{IN} = T2/T1 \times V_R - T2/T1 \times Vos - Vos \quad (2)$$

The second and third terms in the equation (2) indicate an error caused by the offset voltage Vos.

In the conventional circuit, an additional means for compensating for the offset voltage Vos is used in order that the offset voltage Vos does not adversely affect the conversion accuracy. For example, the offset voltage is manually adjusted to be zero every A/D conversion. In another example, the offset voltage Vos is applied to a capacitor which is additionally provided for charging it. At the integration time, the offset voltage Vos is superposed on the analog input voltage $V_{IN}$ and the reference voltage $-V_R$ thereby to eliminate the effect of the offset voltage Vos.

The first method by manual operation is disadvantageous when the A/D converter is fabricated as an integrated circuit. The second method is also disadvantageous in that the capacitance must be at least approximately 0.1 (μF). Accordingly, in fabricating the circuit, the capacitor must be externally attached to the circuit with the result that the number of parts increases which increases the manufacturing cost.

SUMMARY OF THE INVENTION

Accordingly, an object of the invention is to provide an integrating analog to digital converter in which the offset voltage of an operational amplifier in an integration circuit may be compensated for without an external part such as a capacitor, with a high accuracy of A/D conversion and in a manner suitable for integrated circuit fabrication.

To achieve the above object, there is provided an A/D converter comprising: a first reference voltage terminal; a second reference voltage terminal; intermediate voltage generating means for generating an intermediate voltage between the first and second reference voltages; integrating means having two input terminals, the first input terminal connected to the intermediate voltage generating means for integrating the voltage difference between the voltages applied to the two input terminals, and control means responding to an integration output signal from the integrating means and, when the integration output signal coincides with a third reference voltage, starts its counting operation while at the same time producing a first signal which causes the switch means to couple the first reference voltage terminal with the second input terminal of the integrating means, and causes the integrating means to integrate a difference voltage between the intermediate voltage and the first reference voltage and, after a given time lapse, produces a second signal which causes the switch means to couple the second reference voltage terminal to the second input terminal of the integrating means and causes the integrating means to integrate a difference voltage between the intermediate voltage and the second reference voltage, and which control means counts a time over a second period from the initiation of the production of the second signal until the integration output voltage coincides with the third reference voltage, and produces a third signal which causes the intermediate voltage generating means to compensate an intermediate voltage in accordance with a time difference between the first and second periods, and then produces a fourth signal which causes the switch means to couple the analog input terminal with the second input terminal of the integrating means, and causes the integrating means to integrate a difference voltage between the intermediate voltage and the analog input voltage, and produces a digital signal in accordance with the integration output, after the fourth signal is produced.

BRIEF DESCRIPTION OF THE DRAWING

FIG. 6 shows a circuit diagram of a control circuit and a counter circuit used in the A/D converter of FIG. 3;

FIGS. 7A through H show a set of wave forms of signals at the respective points in the A/D converter of FIG. 3 during the offset compensating period; and FIGS. 8A to M show a set of wave forms at the respective portions of the A/D converter of FIG. 3 during an A/D converting period.

DETAILED DESCRIPTION OF THE PREFERRED EMBODIMENTS

Figure 1:
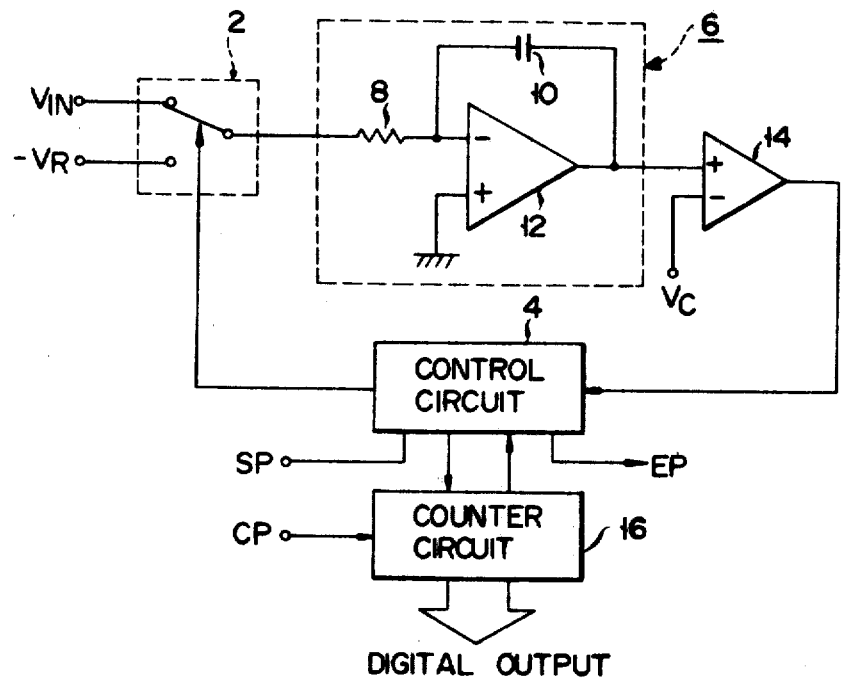
FIG. 1 shows a block diagram of a conventional A/D converter.
Figure 2:
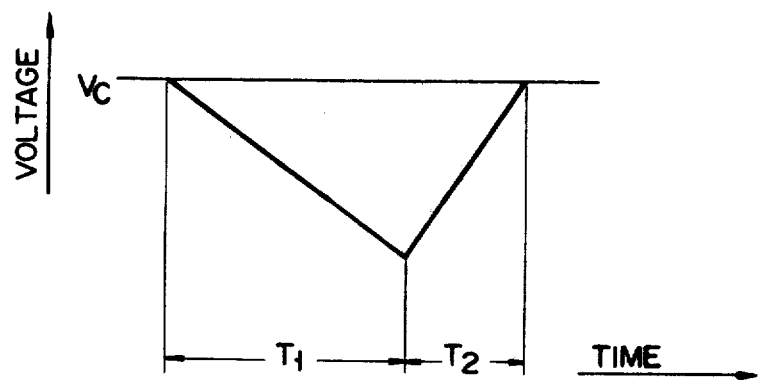
FIG. 2 shows a wave form of an integration output signal for illustrating the operation of the A/D converter of FIG. 1.
Figure 3:
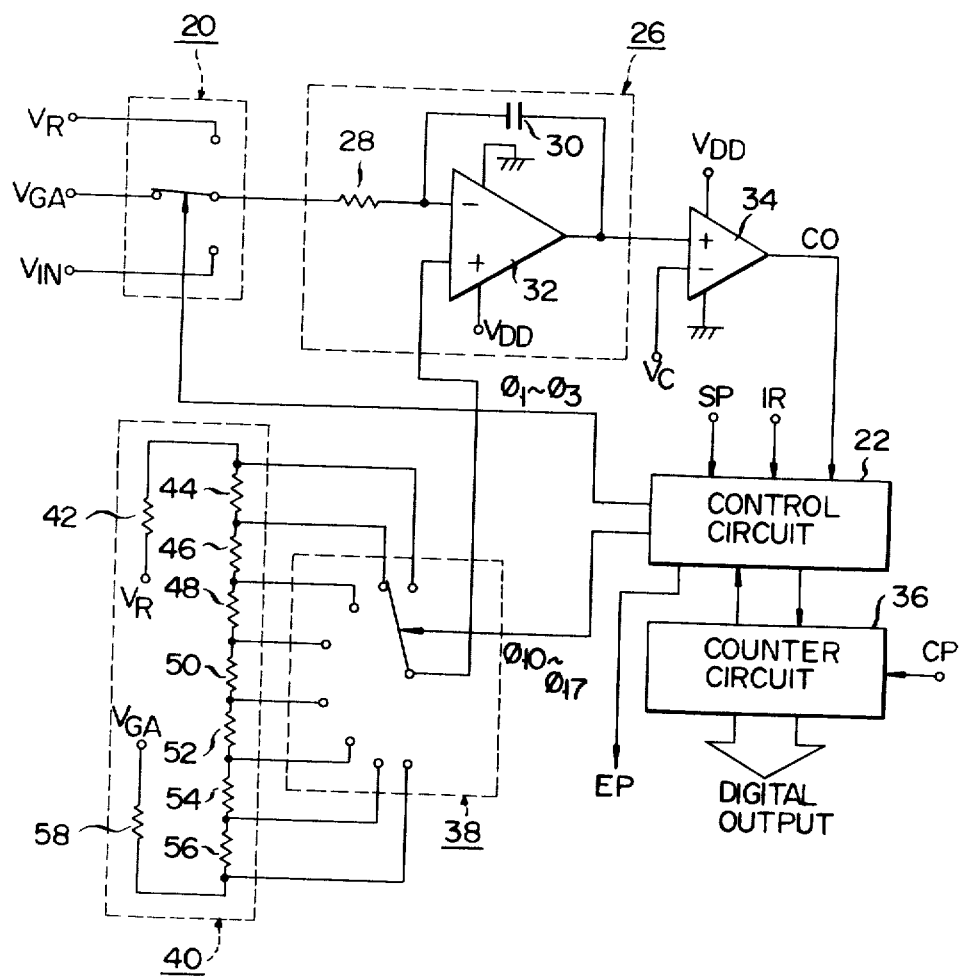
FIG. 3 shows a block diagram of an embodiment of the A/D converter according to the invention.

Reference is made to FIG. 3 illustrating an embodiment of an A/D converter according to the invention. As shown, a reference voltage $V_R$, an analog ground voltage $V_{GA}$ and an unknown analog input voltage $V_{IN}$ to be converted into a digital form are applied to a first switch circuit 20. The reference voltage $V_R$ is a drive power source $V_{DD}$ of the A/D converter, the analog ground voltage $V_{GA}$ is the ground potential of the A/D converter, and the analog input voltage $V_{IN}$ and the reference voltage $V_R$ are of the same polarity (in this embodiment, a positive polarity). The first switch circuit 20, under control of the control circuit 22, selectively supplies the voltages $V_R$, $V_{GA}$ and $V_{IN}$ to an integration circuit 26. The integration circuit 26 includes an integration resistor 28, an integration capacitor 30 and an operational amplifier 32. The operational amplifier 32, which is driven by a single power source $V_{DD}$, receives at the inverted input terminal (−) an output signal from the switch circuit 20 through the integration resistor 28, with the connection of the integration capacitor 30 between the inverted input terminal (−) and the output terminal.

The output signal from the integration circuit 26 is supplied to one of the input terminals of a comparator 34 which is also driven by a single power source $V_{DD}$. The output signal is compared with a threshold voltage Vc applied to the other terminal of the comparator 34. The threshold voltage Vc is derived from the connection point of the resistors connected between the reference voltage terminal $V_R$ and the analog ground voltage terminal $V_{GA}$. The threshold voltage is approximately 80% of the reference voltage $V_R$. The comparator 34 supplies an output signal CO in accordance with the results of the comparison. The comparator 34 serves as a called zero detector. When the integration output voltage crosses the threshold voltage from low to high, the output signal CO changes from LOW to HIGH level. In the inverse case, the signal CO changes from HIGH to LOW level.

The control circuit 22 produces a counter control signal to a counter 36 when receiving an initial set signal IR for setting an initial state of the A/D converter, a start signal SP for initiating the A/D converting operation, and the comparator output signal CO. The counter circuit 36 receives the counter control signal to sequentially count clock pulses CP and applies the count output signal to the control circuit 22 and finally produces a digital signal A/D converted. Upon receipt of the count output signal, the control circuit 22 supplies switching control signals $\phi 1$ to $\phi 3$ to a first switch circuit 20 and switching control signals $\phi 10$ to $\phi 17$ to a second switch circuit 38, and finally produces an A/D end signal EP.

The second switch circuit 38 is connected to an intermediate voltage generating circuit 40 which produces different intermediate voltages (in this case 8 voltages) having values between the reference voltage $V_R$ and the analog ground voltage $V_{GA}$, for example, $\frac{1}{2} V_R + V\delta 1$, $\frac{1}{2} V_R + V\delta 2$, ... $\frac{1}{2} V_R + V\delta 8$. The switch circuit 38 responds to the switching control signals $\phi_{10}$ to $\phi_{17}$ to select one of the eight intermediate voltages and applies the selected voltage to the non-inverted input terminal (+) of the operational amplifier 32.

The intermediate voltage generating circuit 40 includes a relatively large resistor 42, relatively small resistors 44 to 56, and another relatively large resistor 58, connected in series between the reference voltage terminal $V_R$ and the analog input voltage $V_{GA}$. Each connection point among those resistors is connected to the second switch circuit 38.

Figure 4:
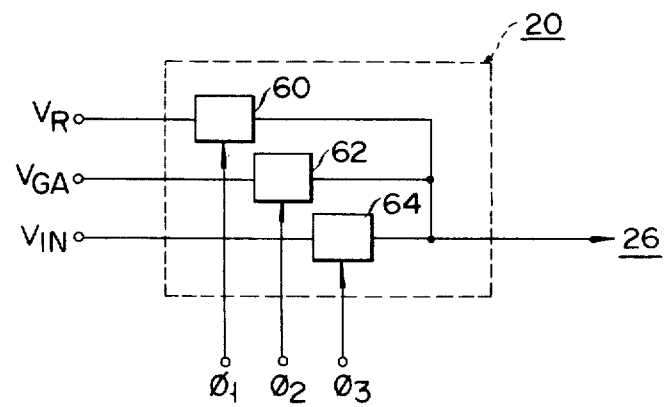
FIG. 4, FIG. 5 show wiring diagrams of first and second switch circuits used in the A/D converter shown in FIG. 3.

The details of the first switch circuit 20 are illustrated in FIG. 4. One end of switch elements 60 to 64 are supplied with the reference voltage $V_R$, the analog ground voltage $V_{GA}$ and the analog input voltage $V_{IN}$, respectively. The other ends of the switch elements 60 to 64 are commonly connected to one end of the integration resistor 28 of the integration circuit 26. The switching control signals $\phi 1$ to $\phi 3$ produced by the control circuit 22 are supplied to the switch elements 60 to 64, respectively. These switch elements 60 to 64 are so arranged that, when the switch control signals $\phi 1$ to $\phi 3$ are HIGH in level, the switch elements corresponding to such signals are closed, and when the switch control signals $\phi 1$ to $\phi 3$ are LOW, the corresponding switches are open.

Figure 5:
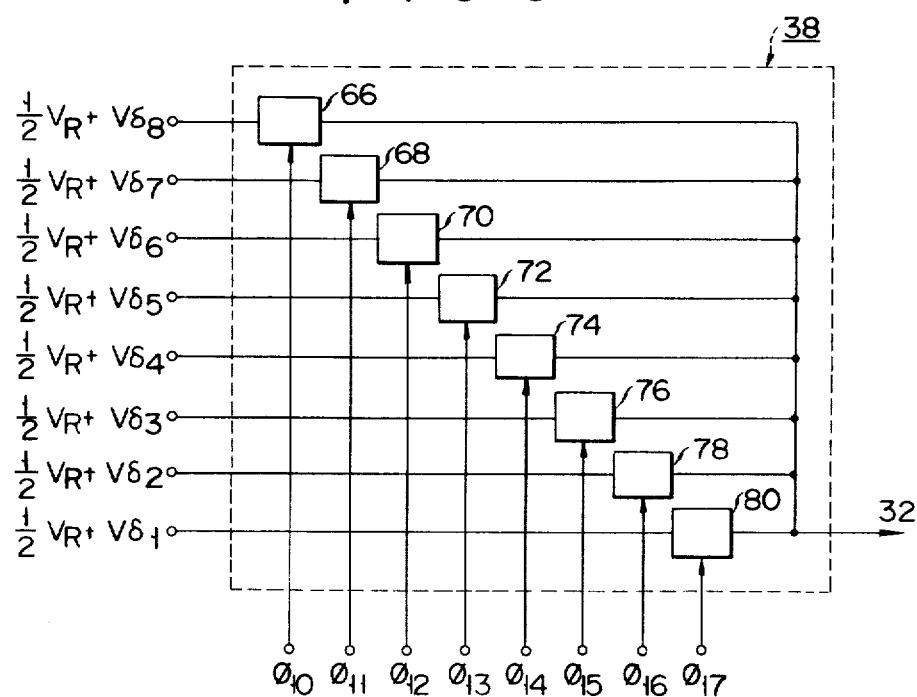

FIG. 5 shows the details of the second switch circuit 38. One end of the switch elements 66 to 80 are supplied with eight intermediate voltages $\frac{1}{2} V_R + V\delta 8$, $\frac{1}{2} V_R + V\delta 7$, ... $\frac{1}{2} V_R + V\delta 2$, $\frac{1}{2} V_R + V\delta 1$, respectively, which are derived from the connection points between adjacent resistors of the intermediate voltage generating circuit 40. The other ends of switch elements 66 to 80 are connected commonly to the non-inverted input terminal (+) of the operational amplifier 32. The switching control signals $\phi 10$ to $\phi 17$ produced from the control circuit 22 are applied to those switch elements, respectively. Like the switch elements 60 to 64, those switches 66 to 80 close when the switching control signal is HIGH and open when it is LOW.

FIG. 6 shows the details of the control circuit 22 and the counter circuit 36. As shown, the output signal CO from the comparator 34 passes through a delay circuit 82 and then passes, together with an initial reset signal IR, through an OR gate 84 to enter a 10-bit binary counter 86 of the ripple carry type, through its reset terminal R. The clock input terminal CLK of the binary counter 86 is supplied with the clock pulses CP. When the input level at the reset terminal R is HIGH, the counter outputs Q0 to Q9 are all LOW in level, that is to say, the count output is zero. When clock pulses CP are counted from a state that the count outputs Q0 to Q9 are all LOW, the count output Q9 changes from LOW to HIGH after the lapse of time corresponding to one pulse period of the clock pulse CP times 512. The counted outputs Q2 to Q9 are applied in parallel to a latch circuit 88 and to an OR gate 90. When a signal supplied to the clock input terminal CLK of the latch circuit 88 is HIGH, the counter outputs Q2 to Q9 of the binary counter 86 are loaded into the latch circuit 88. When it is LOW, the latch circuit 88 holds the loaded data held therein while producing digital output signals B0 to B9.

The output signal from the OR gate 90 is applied to a latch circuit 92 receiving the comparision output CO as an input signal. The output signal from the latch circuit 92 is delayed for a given time period by a delay circuit 94. The output signal from the delay circuit 94 is supplied to the reset terminal R of the latch circuit 92 and is also supplied to an AND gate 96. The output of the AND gate 96 is supplied to a clock input terminal CLK of the binary counter 98. When the initial reset signal IR supplied to the reset terminal R is HIGH, the count outputs Q20 to Q22 of the binary counter 98 are all LOW. When IR is LOW, the counter sequentially counts the output pulses of the AND gate 96.

The counter output Q20 of the binary counter 98 is directly applied to AND gates 102, 106, 110 and 114 and is applied in parallel to AND gates 100, 104, 108 and 112, through an inverter 116. The counter output Q21 is directly applied to AND gates 104, 106, 112 and 114 and is indirectly applied to AND gates 100, 102, 108 and 110, through an inverter 118. The counter output Q22 is directly applied to AND gates 108, 110, 112 and 114 and is indirectly applied to AND gates 100, 102, 104 and 106, through an inverter 120. The circuit arrangement including the binary counter 98, the AND gates 100 to 114 and the inverters 116 to 120 operates such that when the signal IR is LOW, one of the output signals $\phi 10$ to $\phi 17$ from the AND gates 100 to 114 is HIGH while the remaining ones are all LOW. The output signals $\phi 10$ to $\phi 17$ from the AND gates 100 to 114 are applied as switching control signals to the second switch circuit 38 shown in FIG. 3.

An AND gate 122 is supplied with a signal Q30 (to be described later) and the comparing output CO. The output signal from the AND gate 122 is applied to OR gate 124, together with the initial reset signal IR. The output of the OR gate 124 is supplied to the clock input terminal CLK of the latch circuit 88 and to the reset terminal R of the flip-flop 126. The set terminal S of the flip-flop 126 is supplied with a start signal SP and the Q output signal serves as an A/D conversion end signal EP, and is fed back to the AND gate 122 delayed by a given time period by the delay circuit 128 and is also directly applied in parallel to the AND gates 130 and 132. The $\bar{Q}$ output of the flip-flop 126 is supplied to the AND gate 134.

A signal Q30 to be described later is applied to a rising edge detection circuit 136. A count output Q9 of the most significant digit of the binary counter 86 is supplied to a rising edge detection circuit 138. These detecting circuits 136 and 138 detect the times when the signals supplied to the input terminal change from LOW to HIGH and produce HIGH signals PQ30 and PQ9, respectively, for a given period of time after the detection. The output signal PQ30 of the detecting circuit 136 is applied to an AND gate 130 through the inverter 140 and is directly applied to an OR gate 142 and an AND gate 132. The output signal PQ9 of the detecting circuit 138 is supplied to the AND gate 130, an OR gate 144, and the AND gate 134.

An OR gate 146 receives the comparing output signal CO and the initial reset signal IR and produces an output signal to the set terminal S of the flip-flop 148. The output signal from the AND gate 130 is applied to the reset terminal R of the flip-flop 148. The output signal of flip-flop 148 and, the counter output Q9 of the most significant digit from the binary counter 86, are applied to an AND gate 150. The output signal from the AND gate 150 is applied to the clock input terminal CLK of the one bit binary counter 152. The output signal from the OR gate 84 is applied to the reset terminal R of the one bit binary counter 152 which produces an output Q30 directly applied to the AND gate 122, the rising edge detecting circuit 136 and the AND gate 96 through an inverter 154.

A flip-flop 156 is supplied at the set terminal S with the output signal from the AND gate 130 and at the reset terminal R with the output of the OR gate 142. The other input terminal of the OR gate 142 is supplied with the initial reset signal IR. The set terminal S of a flip-flop 158 accepts the comparing output signal CO and the reset terminal R accepts the output signal from an OR gate 144. The other input terminal of the OR gate 144 also accepts the signal IR. The output signal from an OR gate 160 to which the output signals from the AND gates 132 and 134, and the signal IR are applied is supplied to the set terminal S of the flip-flop 162 and the comparing output signal CO is applied to the reset terminal R of the flip-flop 162. The output signals $\phi 1$ to $\phi 3$ of these flip-flops 158, 162 and 156 are supplied as switching control signals to the first switch circuit 20 as shown in FIG. 3.

The operation of the A/D converter thus constructed will now be described. The integration execution period of time of the integration circuit 26 is divided into a period of A/D converting execution and a standby period of no A/D converting execution. During the standby period, the compensating operation of the offset voltage of the operational amplifier 32 is performed. Therefore, it is conceivable that, during the period of A/D converting execution, a converting error arising from the offset voltage can be calibrated to be below a given level.

The operation of the A/D conversion during the standby period for the offset voltage compensation will be described with reference to the timing diagrams shown in FIGS. 7A to 7H. In the figures, FIG. 7A shows an integration output of the integration circuit 26 and Vc indicates a threshold voltage of the comparator 34. FIG. 7B a comparing output CO; FIG. 7C an output signal from the first switch circuit 20 with a HIGH level indicating the reference voltage $V_R$ and a LOW level indicating the analog ground voltage $V_{GA}$; FIGS. 7D and 7E are the switch control signals $\phi 1$ and $\phi 2$; FIG. 7F, the counter output Q9 of the most significant digit of the binary counter 86; FIG. 7G an output signal PQ9 of the rising edge detection circuit 138; and FIG. 7H an output signal from the delay circuit 94.

An intermediate voltage signal having a level equal to $\frac{1}{2}V_R+V\delta 5$ is produced at the connection point between the resistors 48 and 50 of the intermediate voltage generating circuit 40 and is selectively applied by the second switch circuit 38 to the non-inverted terminal (+) of the operational amplifier 32. The offset voltage Vos exists in the operational amplifier 32. Under this condition, the offset compensating operation starts from a condition wherein the integration output signal from the integrating circuit 26 is positioned at the level of the threshold voltage Vc. The integration circuit 26 first integrates the reference voltage $V_R$ over a time period T1 corresponding to the given number of clock pulses CP. The reference voltage $V_R$ is of positive polarity so that integration output signal descends as shown in FIG. 7A. At the end of the period T1, the integration circuit 26 integrates the analog ground voltage $V_{GA}$. The integration output ascends as shown in FIG. 7A. At this time, the following equation holds $$1/C \int_{T1} \frac{(\frac{1}{2}V_R + V\delta 5 - V_{os}) - V_R}{R} dt + \quad (3)$$

$$1/C \int_{T2} \frac{\frac{1}{2}V_R + V\delta 5 - V_{os}}{R} dt = 0$$

where T2 is the time period until the integration output signal reaches the threshold voltage, C is the capacitance of the integration capacitor 30, and R the resistance of the integration resistor 28. The factors $V_R$, $V\delta 5$, Vos and R are not changed during the periods T1 and T2, the equation (3) can thus be rewritten $$T2 \frac{\frac{1}{2}V_R - V\delta 5 + V_{os}}{\frac{1}{2}V_R + V\delta 5 - V_{os}} T1 \quad (4)$$

As seen from equation (4), the value of T2 takes a value slightly deviated from T1 in accordance with a difference of the value $V\delta 5 - V_{os}$ from zero. For example, when T1 is equal to the period corresponding to the period 512 times the one pulse period of the clock pulse CP, T2 is the period corresponding to that 516 times of one pulse. The offset voltage Vos is different for every operational amplifier and the drift of each amplifier depends on its ambient condition such as ambient temperature. Therefore, it is impossible to find in advance a correct value of the offset voltage. It is also difficult to set in advance the intermediate voltage produced by the intermediate voltage generating circuit 40. However, it is possible to set in advance the intermediate voltage to be several different voltages approximating $\frac{1}{2}V_R$ such as $\frac{1}{2}V_R+V\delta 1$ to $\frac{1}{2}V_R+V\delta 8$. Particularly, when the A/D converter is fabricated into an integrated circuit, it is relatively easy to set those voltages on a single silicon chip. Further, by automatically selecting a difference voltage $V\delta i$ for the intermediate voltage $\frac{1}{2}V_R$ (i=1 to 8) so as to satisfy the following relation for a specific i, the effect of the offset voltage Vos may be cancelled $$V\delta i - V_{os} \simeq 0 \quad (5)$$

When this relation is satisfied, equation (4) can be rewritten as $$T2 \simeq T1$$

In other words, if the voltage $\frac{1}{2}V_R+V\delta i$ (i=1 to 8) is selected by the intermediate voltage generating circuit 40 so as to set T2≃T1, the operation of the integration circuit 26 is not affected by the offset voltage Vos.

The operation of the A/D converter will be now described in further detail. It is first assumed that the analog ground voltage $V_{GA}$ is applied to the integration circuit 26. Under this condition, the switch elements 60, 62 and 64 are in open, closed and open states, respectively, and the switch control signals $\phi 1$, $\phi 2$ and $\phi 3$ produced from the flip-flops 158, 162 and 156 are, respectively, LOW, HIGH and LOW in level. The second switch circuit 38 is assumed to have selected the intermediate voltage $\frac{1}{2}V_R+V\delta 5$ between the resistors 48 and 50 in the intermediate voltage generating circuit 40. As a result, the integrating circuit 26 integrates a difference voltage between the intermediate voltage $\frac{1}{2}V_R+V\delta 5$ and the analog ground voltage $V_{GA}$ so that the integration voltage rises to reach the threshold voltage Vc at point a in FIG. 7A. At this time, the comparator output CO rises to be HIGH in level as shown in FIG. 7B. When the output signal CO becomes HIGH, the flip-flop 158 is set while the flip-flop 162 is reset. The switch control signals $\phi 1$ and $\phi 2$ from the flip-flops 158 and 162, respectively, change to be HIGH and LOW in level, as shown in FIGS. 7D and 7E. As a result, the switch element 62 having been in closed state becomes in open state, and the switch element 60 becomes in closed state. Accordingly, the output voltage from the first switch circuit 20 is switched from the analog ground voltage $V_{GA}$ to the reference voltage $V_R$, and the integrating output descends as shown in FIG. 7A with the result that the comparing output CO becomes a pulsating signal as shown in FIG. 7B. When the signal CO is applied to the latch circuit 92, if the output signal from the OR gate 90 is HIGH, the output signal from the latch circuit 92 becomes HIGH after the signal CO is applied. The output from the latch circuit 92 is delayed by a given time period and the delayed output becomes a reset signal for the latch circuit 92 so that the delay output signal also becomes a pulsating signal having a HIGH level. The pulsating delayed output signal is applied as a clock input signal to the binary counter 98 through the AND gate 96. As a result, the binary counter 98 sequentially counts the pulses to step forwardly by one the states of the count outputs Q20, Q21 and Q22. More specifically, when the intermediate voltage $\frac{1}{2}V_R+V\delta 5$ is selected by the second switch circuit 38 (the count outputs Q20, Q21 and Q22 are HIGH, HIGH and LOW, respectively, and only the count output $\phi 13$ of the AND gate 106 is HIGH), the counting by the binary counter 98 of the output pulses of the delay circuit 94 causes the count outputs Q20, Q21 and Q22 to be LOW, LOW and HIGH. The output signal from the AND gate 108 and the switch control signal $\phi 14$ then become HIGH.

Accordingly, in place of the intermediate voltage $\frac{1}{2}V_R+V\delta 5$ being inputted to the non-inverted input terminal (+) of the operational amplifier 32, the intermediate voltage $\frac{1}{2}V_R+V\delta 4$ is inputted. The switching of the intermediate voltage is performed at a point between the ascending and descending states of the integrating output voltage.

The comparing output CO is applied through the delay circuit 82 and the OR gate 84 to the reset terminal R of the binary counter 86 so that the count outputs Q0 to Q9 of the binary counter 86 are all LOW. Following the point a shown in FIG. 7A, the integration circuit 26 integrates a difference voltage between the intermediate voltage ½$V_R$+V δ4 and the reference voltage $V_R$ so that the output voltage descends with an inclination of (−½$V_R$+Vδ4−Vos)R·C. The binary counter 86 again counts the supplied clock pulse CP.

When the binary counter 86 counts the clock pulse for a given time period T1 (in this example, 512 clock pulses), the count output Q9 of the most significant bits (point b in FIG. 7A) changes from LOW to HIGH as shown in FIG. 7F. In response to this level change of the count output Q9, the output PQ9 of the rising edge detection circuit 138 becomes a pulsating signal as shown in FIG. 7G. At this time, the start pulse SP is not yet inputted to the flip-flop 126, so that the flip-flop 126 remains reset, with its output $\bar{Q}$ being HIGH. After the output PQ9 of the rising edge detection circuit 138 becomes HIGH, the output of the AND gate 134 becomes HIGH. Then, the output of the OR gate 160 becomes HIGH so that the flip-flop 162 is set. Further, when the detecting output PQ9 becomes HIGH, the output signal from the OR gate 144 also becomes HIGH, resulting in the reset of the flip-flop 158. Therefore, the switch control signal φ2 changes from LOW to HIGH, as shown in FIG. 7E, and the control signal φ1 changes from HIGH to LOW, as shown in FIG. 7D. At this point, the period T1 for integrating the reference voltage $V_R$ by the integration circuit 26 is completed and after the point b shown in FIG. 7A, the integration circuit 26 integrates a difference voltage between the intermediate voltage ½$V_R$+Vδ4 and the analog ground voltage $V_{GA}$ and an integrating output voltage ascends with an inclination of (½$V_R$+Vδ4−Vos)R·C.

The inclination of the descending and ascending integration output voltage changes in absolute value in accordance with a difference of the (value Vδ4−Vos) from zero. This means that the time period T1 is different from a period T2a from the time that the integration output voltage ascends after the period T1 until it reaches the threshold voltage Vc. The time period corresponding to the period T2a is measured by the control circuit 22 to judge whether this time is equal to the given period T1 within a given accuracy. If they are not equal to each other, it is judged that the offset voltage Vos is not compensated and the intermediate voltage ½$V_R$+Vδ4 is switched to another intermediate voltage ½$V_R$+Vδ3.

The integrating output voltage again reaches the threshold value Vc at a point c in FIG. 7A. As a result, the comparing output CO becomes HIGH in level and the output signal from the OR gate 90 is latched in the latch circuit 92. The OR gate 90 has by then received the count outputs Q2 to Q9 of the binary counter 86. If the period T2a is equal to the period T1 within a given accuracy, the count output signals Q2 to Q9 are all LOW. However, if the periods T2a and T1 are not equal, any one of the count outputs Q2 to Q9 of the binary counter 86 becomes HIGH so that the delay circuit 94 produces a pulse of HIGH level. As a result, the states of the count outputs Q20 to Q22 of the binary counter 98 are stepped forward by one step so that the counter outputs, Q20, Q21 and Q22, change from LOW, LOW and HIGH, respectively, to HIGH, LOW and HIGH, respectively, and the output signal, i.e. the switch control signal φ15, of the AND gate 110 becomes HIGH. Therefore, the second switch circuit 38 selects the intermediate voltage ½$V_R$+Vδ3 in place of the intermediate voltage ½$V_R$+Vδ4. The inclination of the integration output voltage during the succeeding periods T1 and T2b are different from those during the preceding periods T1 and T2a, by the voltages Vδ4 and Vδ3. More particularly, the inclination of the integration output voltage during the period T2b is expressed by (−$V_R$/2+Vδ3−Vos)R·C and the inclination during the period T2B is $V_R$/2+Vδ3−Vos/R·C.

At the end of the period T2b, i.e. the point d in FIG. 7A, it is judged whether the periods T2b and T1 are equal within the given accuracy. When those are not equal, the delay circuit 94 produces a pulse of HIGH value, as shown in FIG. 7H. Accordingly, during the next period T1 and T2c, ½$V_R$+Vδ2 is selected as the intermediate voltage. When T2b and T1 are equal, the output signal from the delay circuit 94 remains LOW so that, during the succeeding periods T1 and T2c, ½$V_R$+Vδ3 is selected like the preceding periods T1 and T2b. In this example, the periods T2b and T1 are not yet equal, and are equal only during the compensation cycle after the intermediate voltage ½$V_R$+Vδ2 is selected. The timing corresponds to a point e shown in FIG. 7A.

The fact that those periods T1 and T2c are equal indicates that the relation Vδ2≃Vos holds within a given accuracy. At this time, the inclination when the integration output voltage ascends is equal in absolute value to that when it descends and that inclination is given by $V_R$/(2·R·C). As a result, the intermediate voltage which is selected by the second switch circuit 38 and is applied to the non-inverted input terminal (+) of the operational amplifier 32 is exactly half of the reference voltage $V_R$ so that the offset voltage Vos of the operational amplifier 32 is cancelled. Because of this, even if the reference voltage $V_R$ and the analog input voltage $V_{IN}$ are of the same polarity, A/D conversion is possible. In the case where the intermediate voltage is formed by a diffusion resistor within a semiconductor integrated circuit, intermediate voltages which are slightly different one another are more easily provided that if the, intermediate voltage was required to be exactly one half the value of the reference voltage $V_R$, or if it was necessary to provide a capacitor for compensating for the offset voltage. Therefore, this makes it easy to form an integrated circuit of the A/D converter.

As described above, during the standby period of no A/D conversion, the integration circuit 26 integrates the reference voltage $V_R$ during the given period T1 and then integrates the analog ground voltage $V_{GA}$. The period T2 until the integration output signal reaches the threshold voltage Vc, is measured and then the period T2 is compared with the period T1 to check to see if these periods are equal to each other within a given accuracy. If these are not equal to each other, the second switch circuit 38 selects the intermediate voltage and the integration circuit 26 again executes a similar integration. When the periods are coincident, if the control circuit 26 holds the intermediate voltage until the time that the start pulse SP is inputted, the offset voltage of the operational amplifier 32 is compensated during the period for performing the A/D conversion. Further, the operation mentioned above is repeated until the start pulse SP is inputted with the result that both the offset voltage and drift are compensated for even if the ambient conditions such as temperature, change.

When time is measured by counting the clock pulses CP, the accuracy of the time measurement is greater as the number of the clock pulses CP counted increases. In this embodiment, the count outputs Q0 and Q1 of the binary counter 86 shown in FIG. 6 are not inputted to the OR gate 90, the periods T1 and T2 are compared to each other with a required accuracy of within four pulses.

The operation during the A/D conversion period following the standby period for the offset compensation will be described with reference to timing diagrams shown in FIGS. 8A to 8M. FIG. 8A shows an integrating output signal from the integration circuit 26, and Vc designates a threshold voltage; FIG. 8B illustrates an initial reset signal IR; FIG. 8C a start pulse SP; FIG. 8D an A/D conversion end signal EP; FIG. 8E a comparing output signal CO; FIG. 8F shows an output signal from the first switch circuit 20 and, when it is HIGH in level, it represents reference voltage $V_R$, when in a medium level, it is the analog input voltage $V_{IN}$, and when in a LOW level, it is the analog ground voltage $V_{GA}$; FIGS. 8G to I switch control signals $\phi 1$ to $\phi 3$; FIG. 8J the count output Q9 of the most significant digit of the binary counter 86; FIG. 8K the count output Q30 of the binary counter 152 of one bit; FIGS. 8L and 8M the outputs PQ9 and PQ30 of the rising edge detection circuit 138 and 136.

First, the initial reset signal IR is released from HIGH level to LOW level, as shown in FIG. 8B. At this time, the flip-flops 148, 156, 162 and 126 are still held in the initial state. That is to say, the flip-flops 148 and 162 are in the set state and the flip-flops 156, 158 and 126 are in the reset state. The count outputs Q0 to Q9 of the binary counter 86 are all in LOW level. Until the start pulse SP is inputted, the offset compensating operation is repeated.

As shown in FIG. 8A, within the period T3 where the integration circuit 26 integrates the reference voltage $V_R$, if the start pulse SP is inputted, as shown in FIG. 8C, the flip-flop 126 is set and the A/D converting end signal EP, which is the Q output of the flip-flop 126, becomes HIGH. If this state of the signal EP is detected, it is confirmed that the A/D conversion is being executed. The first period for the A/D conversion is the period for integrating the reference voltage $V_R$ for a predetermined period T3 and the inclination of the integrating output signal is expressed by $-VR/(2 \cdot R \cdot C)$. In this embodiment, the control circuit 22 and the counter circuit 36 are constructed so that the period T3 is equal to the period permitting the offset compensation to be currently made. Accordingly, the operation of the A/D converter during the period T3 is substantially the same as that during the period T1. When the binary counter 86 counts for the period corresponding to 512 times the period of one clock pulse CP, the count output Q9 becomes HIGH as shown in FIG. 8J. The output signal PQ9 of the rising edge detector circuit 138 also becomes a HIGH level pulse, as shown in FIG. 8L and is supplied to the AND gate 134. However, since the flip-flop 126 is in the set state, a HIGH Q output signal is applied to the AND gate 130 and the $\overline{Q}$ output of a LOW level is applied to the AND gate 134. Therefore, the AND gate 134 is not enabled, the flip-flop 162 is not set, and the switch control signal $\phi 2$ is still a LOW level, as shown in FIG. 8H. At the output timing of the signal PQ9, the signal Q30 is always a LOW level, as shown in FIG. 8K so that the AND gate 130, which has been supplied with the signal PQ30 through the inverter 140, is enabled and then the flip-flop 156 is set. As a result, as shown in FIGS. 8G to 8I, the switch control signal $\phi 3$ is HIGH and the remaining signals $\phi 1$ and $\phi 2$ are LOW so that the first switch circuit 20 selects the analog input voltage $V_{IN}$.

During the subsequent period, the integration circuit 26 integrates the analog input voltage $V_{IN}$ and the inclination of the integration output is given by $(V_R/2 - V_{IN})/(R \cdot C)$. The integration output increases or decreases depending on the magnitude of the analog input voltage. In this embodiment, the analog input voltage $V_{IN}$ is of the same polarity as that of the reference voltage $V_R$ and is larger than $\frac{1}{2} V_R$. The period T4 for integrating the analog input voltage $V_{IN}$ equals the period T3, i.e. equals the period T1. The binary counter 86 serves as a down counter and after a lapse of time corresponding to 512 pulses of the clock CP after the start of the period T4, the count output Q9 of the binary counter 86 changes from HIGH to LOW. At the time that the count output Q9 of the binary counter 86 changes to be LOW in level and the output of the flip-flop 148 is still HIGH, the output of the AND gate 150 changes from HIGH to LOW. Accordingly, the output Q30 of the binary counter 152 rises from LOW to HIGH, as shown in FIG. 8K. Then, the detecting circuit 136 detects the rising edge of the signal Q30 to produce a HIGH pulse signal PQ30, as shown in FIG. 8M. At the leading edge of the output PQ30, the flip-flop 162 is set and the flip-flop 156 is reset. As a result, the switch control signal $\phi 2$ becomes HIGH while the control signal $\phi 3$ becomes LOW. Accordingly, the period T4 for integrating the analog input voltage $V_{IN}$ terminates and the first switch circuit 20 selects the analog ground voltage $V_{GA}$ and the period T5 to permit the integrating circuit 26 to effect the integration starts.

At the start of the period T5, the count outputs Q0 to Q9 of the binary counter 86 are all LOW. The integrating output signal, when the analog ground voltage $V_{GA}$ is integrated, rises with an inclination of $V_R/(2 \cdot R \cdot C)$. The time period until the integrating output reaches the threshold voltage until the comparing output CO becomes HIGH is measured by the binary counter 86. This value is proportional to a digital amount of the analog input voltage $V_{IN}$. At this time, the analog input voltage $V_{IN}$ and the reference voltage $V_R$ are related by $$V_{IN} = (T5/2T3) \times V_R \tag{6}$$

where T5 is the period measured. The equation (6) indicates that the reference voltage $V_R$ and the analog input voltage $V_{IN}$ may be of the same polarity and therefore there is no need for a separate power source for the reference voltage. The analog input voltage range allowing A/D conversion extends from the analog ground voltage $V_{GA}$ to the reference voltage $V_R$. Within this range, A/D proportional conversion is possible.

When the comparing output CO becomes HIGH, the AND gate 122 holds so that the output of the AND gate 122 becomes HIGH which in turn is applied through the OR gate 124 to the clock input terminal CLK of the latch circuit 88. At the time that the HIGH signal from the OR gate 124 is produced, the count outputs Q2 to Q9 of the binary counter 86 are read into the latch circuit 88. When the output signal from the OR gate 124 becomes HIGH, the flip-flop 126 is reset and the A/D conversion end signal EP having been HIGH changes to LOW in level. The LOW state is detected and the end of the A/D conversion is confirmed by detecting the LOW state of the signal EP. When the comparing output CO becomes HIGH, the flip-flop 162 is reset and the flip-flop 158 is set. As a result, the integration circuit 26 integrates the reference voltage $V_R$ and the operation shifts to the standby period for compensating for the offset voltage. When the comparing output CO descends to be LOW in level, the latch circuit 88 produces the count outputs Q2 to Q9 stored therein from the binary counter 86 as digital forms.

In this example, the analog ground voltage $V_{GA}$ is equal to the ground voltage of the A/D converter and the reference voltage $V_R$ is equal to the voltage of a power source for driving the A/D converter. This is very convenient when the circuit is fabricated into an integrated circuit, since only one power source is needed. In this case, however, when about half of the power source voltage $V_{DD}$ is applied to the non-inverted input terminal (+) of the operational amplifier 32, it is necessary that the amplification degree not be reduced during normal operation. It is further necessary that the operational amplifier 32 not be saturated up to the power source voltage $V_{DD}$ or the ground voltage by a variation of the output voltage. It is for this reason that about 80% of the power source voltage $V_{DD}$ is selected as the threshold voltage Vc of the comparator 34 and the time constant is properly selected.

It should be understood that the present invention is not limited to the embodiment mentioned above. For example, in changing the level of the intermediate voltage, the polarity of the intermediate voltage may be selected by feeding back a difference between it and the offset voltage, instead of unidirectionally the intermediate voltage. The integration period following the offset calibration period may be used for carrying out a conventional dual-slope integration. The intermediate voltage generation circuit is not limited to the above-mentioned embodiment. Any circuit which, in response to a given control signal, can produce given intermediate voltages, is involved in the intermediate voltage generation circuit according to the invention.

What we claim is:

1. A method of converting an analog signal into a digital signal comprising the steps of:
   providing an integrating circuit having first and second input terminals adapted to receive voltage signals, said integrating circuit for integrating the difference in voltage level between the voltage signals provided to said first and second input terminals to produce an integrating output signal including a voltage offset component;
   supplying a first reference voltage level at a first reference voltage terminal;
   supplying a second reference voltage level at a second reference voltage terminal;
   supplying an analog input voltage to be represented as a digital signal at an analog input terminal;
   supplying a plurality of intermediate voltage levels between said first and second reference voltage levels;
   selecting and applying one of said plurality of intermediate voltage levels to said first input terminal to compensate said integrating circuit for said voltage offset component of said integrating output signal;
   applying said first reference voltage level to said second input terminal of said integrating circuit for a first time period;
   applying said input voltage to said second input terminal of said integrating circuit for a second time period equal to said first time period;
   applying said second reference voltage level to said second input terminal of said integrating circuit for a time period terminated when said integrating output signal is equal to a predetermined voltage level;
   determining a third time period equal in duration to the period that said second reference voltage level was applied to said second input terminal of said integrating circuits; and generating a digital signal proportional to said second reference voltage level, said proportion comprising a ratio of said third time period of said first time period, said digital signal comprising said digital representation of said analog input signal.

2. A method according to claim 1 wherein said step of selecting the intermediate voltage level comprises the steps of:
   applying one of said first and second reference voltage levels to said second input terminal of said integrating circuit for a fourth time period;
   applying the other of said first and second reference voltage levels to said second input terminal of said integrating circuit for a fifth time period until said integrating output obtains said predetermined voltage level;
   determining the duration of said fifth time period; and
   selecting an intermediate voltage level corresponding to the difference between the durations of said fourth and fifth time periods and coupling said selected intermediate voltage level to said first input terminal to compensate the integrating output signal for said voltage offset component thereof.

3. An integrating analog to digital converter having signal offset error compensation comprising:
   a first reference voltage terminal providing a first reference voltage level;
   a second reference voltage terminal providing a second reference voltage level different from said first reference voltage level;
   an analog input terminal providing an analog input signal to be converted to a digital signal;
   an intermediate voltage generating means for generating a plurality of intermediate voltage levels between said first and second reference voltage levels;
   integrating means having a first input terminal connected to said intermediate voltage generating means and a second input terminal, said integrating means for integrating the voltage level difference between an intermediate voltage level supplied to said first input terminal and a voltage inputted to the second input terminal to produce an integrating output signal including a voltage offset component;
   switch means for selectively coupling one of said first reference voltage level, said second reference voltage level, and said analog input signal with said second input terminal of said integrating means; and
   control means for controlling said analog to digital converter to operate in an offset correction mode for compensating for said offset component of said integrating output signal and a converting mode for converting said analog input signal to a digital signal, said control means comprising:
   an offset compensation means for selecting and coupling one of said plurality of intermediate voltage levels to said first input terminal to compensate for said voltage offset component of said integrating output signal; and conversion means comprising:

means for controlling said switch means to supply to said second input terminal (1) said first reference voltage level for a first time period, (2) said analog input signal for a second time period equal in duration to said first time period, and (3) said second reference voltage level for a third time period continuing until said integrating output signal is equal to a predetermined voltage level;

means for determining the duration of said third time period corresponding to the amount of time said second reference voltage level has been supplied to said second input terminal; and means for generating a digital signal proportional to said second reference voltage level, said proportion comprising a ratio of said third time period to said first time period, said digital signal comprising a digital representation of said analog input signal.

4. An integrating analog to digital converter according to claim 3 wherein said offset compensation means comprises:

switch control means for controlling said switch means to supply to said second input terminal of said integrating means one of said first and second reference voltage levels for a fourth time period and then the other of said first and second reference voltage levels for a fifth time period until said integrating output signal equals said predetermined voltage level;

timing means for determining the duration of said fifth time period; and voltage selecting means for selecting one of said plurality of said intermediate voltage levels corresponding to the difference between the durations of said fourth and fifth time periods and for coupling said selected intermediate voltage level to said first input terminal.

5. An integrating analog to digital converter according to claim 3 wherein the durations of said first and fourth time periods are equal to each other or are integral multiples of each other.

6. An integrating analog to digital converter according to claim 3 further including means for continually supplying said selected intermediate voltage level to said first input terminal during the conversion of said analog input signal to said digital representation.

7. An integrating analog to digital converter according to claim 4 wherein said offset compensation means cyclically operates to select one of said plurality of said intermediate voltage levels to compensate for changes in said voltage offset component of said integrating output signal in accordance with changes in the operating conditions of said integrating analog to digital converter.

8. An integrating analog to digital converter according to claim 3 or 7 further including a power source supplying an output voltage level and wherein said one of said first and second reference voltage levels is a ground potential and the other of said first and second reference voltage levels is said output voltage level of said power source.

9. An integrating analog to digital converter according to claim 8 wherein said intermediate voltage generating means comprises:

a resistor network having a plurality of resistors connected between said first and second reference voltage terminals; and a reference switch for selectively coupling either said first reference voltage terminal or said second reference voltage terminal to said first input terminal of said integrating means through one of said plurality of resistors in said resistor network.

10. An integrating analog to digital converter according to claim 9 wherein the durations of said first and fourth time periods are equal to each other or are integral multiples of each other.

* * * * *